(12) United States Patent
Sim et al.

(10) Patent No.: US 9,553,009 B2
(45) Date of Patent: Jan. 24, 2017

(54) SUBSTRATE SEPARATION DEVICE AND SUBSTRATE SEPARATION SYSTEM

(71) Applicant: SAMSUNG ELECTRONICS CO., LTD., Suwon-si (KR)

(72) Inventors: Jae In Sim, Yongin-si (KR); Gyeong Seon Park, Seoul (KR); Kyung Ja Lim, Suwon-si (KR); Seung Woo Choi, Seoul (KR); O Hak Kwon, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 43 days.

(21) Appl. No.: 14/522,937

(22) Filed: Oct. 24, 2014

(65) Prior Publication Data

US 2015/0279707 A1    Oct. 1, 2015

(30) Foreign Application Priority Data

Mar. 25, 2014 (KR) .......................... 10-2014-0034561

(51) Int. Cl.
| | |
|---|---|
| *B32B 38/10* | (2006.01) |
| *H01L 21/683* | (2006.01) |
| *B32B 43/00* | (2006.01) |
| *H01L 21/67* | (2006.01) |
| *H01L 21/687* | (2006.01) |

(52) U.S. Cl.
CPC ......... *H01L 21/6838* (2013.01); *B32B 43/006* (2013.01); *H01L 21/67092* (2013.01); *H01L 21/68735* (2013.01); *H01L 2221/68381* (2013.01); *H01L 2221/68386* (2013.01); *Y10T 156/1132* (2015.01); *Y10T 156/1153* (2015.01); *Y10T 156/1168* (2015.01); *Y10T 156/1911* (2015.01); *Y10T 156/1944* (2015.01); *Y10T 156/1978* (2015.01)

(58) Field of Classification Search
CPC ............ H01L 2221/68381; H01L 2221/68386; B32B 43/006; Y10T 156/1132; Y10T 156/1168; Y10T 156/1944; Y10T 156/1978

See application file for complete search history.

(56) References Cited

U.S. PATENT DOCUMENTS

| | | |
|---|---|---|
| 6,372,608 B1 | 4/2002 | Shimoda et al. |
| 6,645,830 B2 | 11/2003 | Shimoda et al. |
| RE38,466 E | 3/2004 | Inoue et al. |

(Continued)

FOREIGN PATENT DOCUMENTS

| | | |
|---|---|---|
| JP | 4925752 B2 | 5/2012 |
| KR | 10-2002-0037903 A | 5/2002 |

(Continued)

*Primary Examiner* — Mark A Osele
(74) *Attorney, Agent, or Firm* — Sughrue Mion, PLLC

(57) ABSTRACT

There is provided a substrate separation device and method for separating a growth substrate from a laminate structure which includes a support substrate, a semiconductor layer, and the growth substrate. The device includes: a first base which is configured to hold the laminate structure thereon, and includes a first holding unit configured to hold the support substrate defining a bottom surface of the laminate structure and a heating unit configured to heat the laminate structure; and a second base including a second holding unit disposed above the first holding unit and configured to hold the growth substrate defining an upper surface of the laminate structure.

13 Claims, 16 Drawing Sheets

(56) References Cited

U.S. PATENT DOCUMENTS

| | | |
|---|---|---|
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,368,115 B2 | 2/2013 | Yoo |
| 8,399,944 B2 | 3/2013 | Kwak et al. |
| 8,432,511 B2 | 4/2013 | Jeong |
| 8,449,716 B2 * | 5/2013 | Wimplinger ...... H01L 21/67092 156/718 |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 8,997,822 B2 * | 4/2015 | Iwashita ........... H01L 21/67092 156/701 |
| 2006/0032848 A1 | 2/2006 | Lee et al. |
| 2011/0155046 A1 | 6/2011 | Yamazaki |
| 2012/0018732 A1 | 1/2012 | Aida et al. |
| 2012/0231614 A1 | 9/2012 | Wu et al. |
| 2013/0048222 A1 * | 2/2013 | Tanaka .............. H01L 21/67092 156/707 |
| 2013/0280825 A1 * | 10/2013 | Yoshitaka ......... H01L 21/67051 438/14 |
| 2014/0020818 A1 * | 1/2014 | Huang .............. H01L 21/67092 156/152 |

FOREIGN PATENT DOCUMENTS

| | | |
|---|---|---|
| KR | 10-2011-0021562 A | 3/2011 |
| KR | 10-2011-0131017 A | 12/2011 |
| KR | 10-2012-0069302 A | 6/2012 |
| KR | 10-1171359 B1 | 8/2012 |
| KR | 10-2013-0059026 A | 6/2013 |
| KR | 10-2013-0073752 A | 7/2013 |
| WO | 2013/081348 A1 | 6/2013 |

* cited by examiner

SUBSTRATE SEPARATION DEVICE AND SUBSTRATE SEPARATION SYSTEM

CROSS-REFERENCE TO RELATED APPLICATION

This application claims priority from Korean Patent Application No. 10-2014-0034561 filed on Mar. 25, 2014, with the Korean Intellectual Property Office, the disclosure of which is incorporated herein in its entirety by reference.

BACKGROUND

Apparatuses and methods consistent with exemplary embodiments described in the present disclosure relate to a substrate separation device and a substrate separation system.

A laser lift-off (LLO) method is largely used in separating a growth substrate in a process of manufacturing a vertical type light emitting diode (LED). The LLO method is a technique of growing semiconductor epitaxial layers on a growth substrate, bonding a support substrate to an uppermost semiconductor epitaxial layer, and subsequently irradiating a laser beam through the growth substrate to separate the growth substrate from the epitaxial layers.

Here, after bonding the support substrate, bowing may occur due to a difference in coefficients of thermal expansion between the growth substrate and the support substrate. In this case, a focal point of a laser beam may be changed, leading to a failure to transmit energy to an interface between the growth substrate and the epitaxial layers accurately, thereby failing to properly separate the growth substrate.

Failure of transmission of a laser beam due to a defect in the growth substrate, deposition of a metal thin film, contamination, or the like, causes an epitaxial layer or a buffer layer to partially remain, which may damage the growth substrate or the support substrate in the process of separating the growth substrate.

SUMMARY

Various exemplary embodiments provide a substrate separation device, system and method for separating a growth substrate from a laminate structure including a support substrate, a semiconductor layer, and the growth substrate.

However, the inventive concept is not limited thereto and aspects and effects that may be recognized from technical solutions or exemplary embodiments described hereinafter may also be included although not explicitly mentioned.

According to an aspect of an example embodiment, there is provided a substrate separation device for separating a growth substrate from a laminate structure including a support substrate, a semiconductor layer, and the growth substrate. The device may include: a first base which is configured to hold the laminate structure thereon, and includes a first holding unit configured to hold the support substrate defining a bottom surface of the laminate structure and a heating unit configured to heat the laminate structure; and a second base including a second holding unit disposed above the first holding unit and configured to hold the growth substrate defining an upper surface of the laminate structure.

The first holding unit and the second holding unit may be configured to selectively hold the support substrate and the growth substrate through vacuum adsorption, respectively.

The first holding unit may include a body on which the laminate structure is disposed, a plurality of vacuum nozzles exposed to a surface of the body, and a pump connected to the plurality of vacuum nozzles.

The second holding unit may include a vacuum pad configured to contact the growth substrate, nozzles exposed to a surface of the vacuum pad, and a pump connected to the nozzles.

The second base may further include a moving unit connected to the second holding unit and configured to move the second holding unit in a vertical direction.

The moving unit may include a frame unit having a guide fastened to the second holding unit to guide a movement of the second holding unit and a driving unit configured to generate driving force enabling the second holding unit to move along the guide from one end of the frame unit.

The substrate separation device may further include a receiving unit configured to receive the growth substrate separated from the laminate structure.

The receiving unit may include a support frame and a moving plate fastened to the support frame such that the moving plate reciprocates.

The substrate separation device may further include an exhaust unit which is disposed on one side of the first base and configured to outwardly discharge foreign objects generated when the growth substrate is separated.

The exhaust unit may include an exhaust hood open toward the first base, an exhaust pipe communicating with the exhaust hood, and an exhaust pump configured to generate an air stream drawing in (or intaking) foreign objects through the exhaust pipe.

The first base may further include a plurality of lift pins provided in the first holding unit and configured to lift up the laminate structure.

According to an aspect of another exemplary embodiment, there is provided a substrate separation system which may include: a laser irradiation device including a support unit configured to hold thereon a laminate structure comprising the support substrate, a semiconductor layer, and a growth substrate, the support substrate defining a bottom surface of the laminate structure, and heat the laminate structure; and a laser irradiation unit disposed above the support unit and configured to irradiate a laser to the growth substrate defining an upper surface of the laminate structure; and a substrate separation device for separating the growth substrate from the laminate structure to which the laser has been irradiated at an interface between the growth substrate and the semiconductor layer through the laser irradiation device.

The support unit may include a susceptor having a recess provided on one surface thereof on which the support substrate is disposed, and a heater provided on the other surface of the susceptor and configured to heat the susceptor.

The recess of the susceptor may have a U-shaped or V-shaped cross-section.

The susceptor may be formed of aluminum, silicon carbide, or graphite.

According to an aspect of still another exemplary embodiment, there is provided a method of separating a growth substrate from a laminate structure comprising a support substrate, a semiconductor layer and the growth substrate. The method may include: forming the semiconductor layer on the growth substrate; bonding the support substrate to the semiconductor layer at a first temperature using a bonding material; irradiating a laser beam to the laminate structure such that the laser beam is first directed toward the growth substrate; disposing the laminate structure on a substrate separation device such that the support substrate faces a top portion of the substrate separation device; and heating the laminate structure from the support substrate at a second temperature to separate the growth substrate from the semiconductor layer The bonding material may have a eutectic temperature greater than 200° C. The second temperature may be equal to or lower than the first temperature, and the second temperature may range from about 150° C. to a melting point of the bonding material.

The support substrate may include a material having a coefficient of thermal expansion lower than that of the semiconductor layer.

BRIEF DESCRIPTION OF DRAWINGS

The above and other aspects, features and other advantages will be more clearly understood from the following detailed description taken in conjunction with the accompanying drawings, in which.

DETAILED DESCRIPTION

Figure 1:
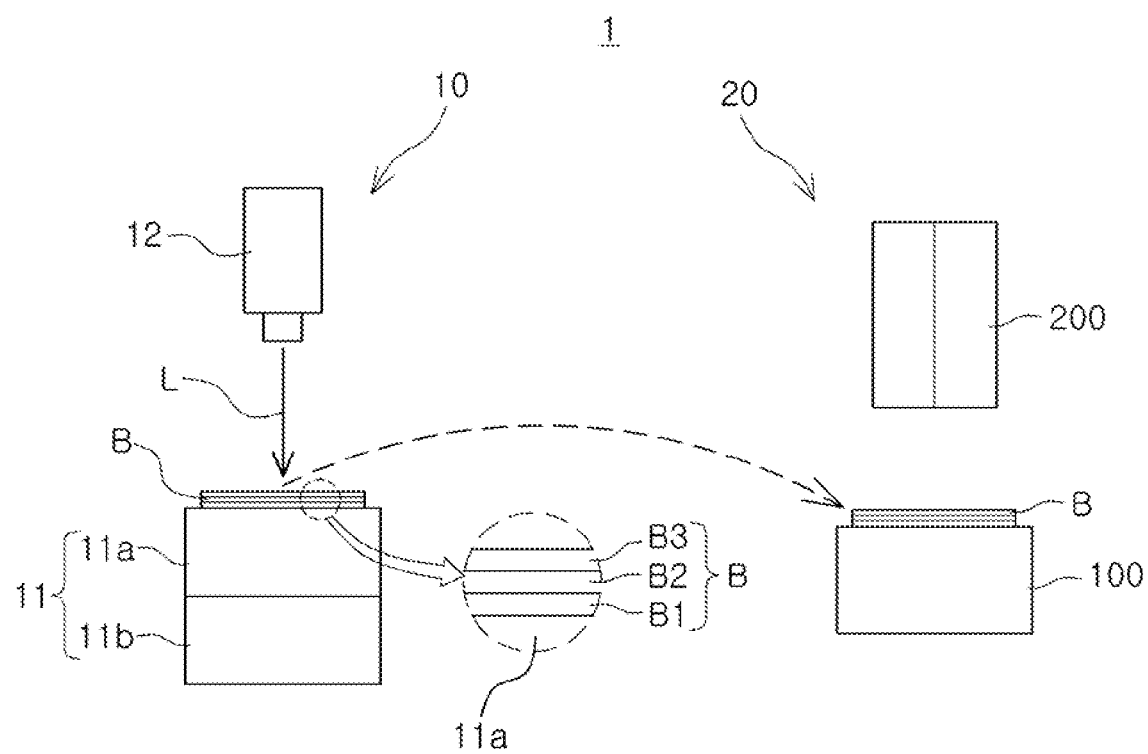
FIG. 1 is a view schematically illustrating a substrate separation system, according to an example embodiment.

Hereinafter, example embodiments of the inventive concept will be described in detail with reference to the accompanying drawings.

The inventive concept may, however, be exemplified in many different forms and should not be construed as being limited to the embodiments set forth herein. Rather, these embodiments are provided so that this disclosure will be thorough and complete, and will fully convey the scope of the inventive concept to those skilled in the art.

In the drawings, the shapes and dimensions of elements may be exaggerated for clarity, and the same reference numerals will be used throughout to designate the same or like elements.

A substrate separation system according to an example embodiment will be described with reference to FIG. 1. FIG. 1 is a view schematically illustrating a substrate separation system according to an example embodiment;

Referring to FIG. 1, a substrate separation system 1 according to an example embodiment may include a laser irradiation device 10 and a substrate separation device 20.

In manufacturing a semiconductor light emitting device, the laser irradiation device 10 irradiates a laser beam L to allow a growth substrate to be separated through a laser lift-off (LLO) scheme.

The laser irradiation device 10 may include a support unit 11, on which a laminate structure B which includes a support substrate B1, a semiconductor layer B2, and a growth substrate B3 is disposed, and a laser irradiation unit 12 irradiating a laser beam L to the laminate structure B.

The laminate structure B may be disposed on the support unit 11, and the support unit 11 may heat the laminate structure B. The support unit 11 may include a susceptor 11a having a recess 11c formed on one surface thereof and allowing the laminate structure B to be disposed therein and a heater 11b provided on the other surface of the susceptor 11a and heating the susceptor 11a.

Figure 2A:
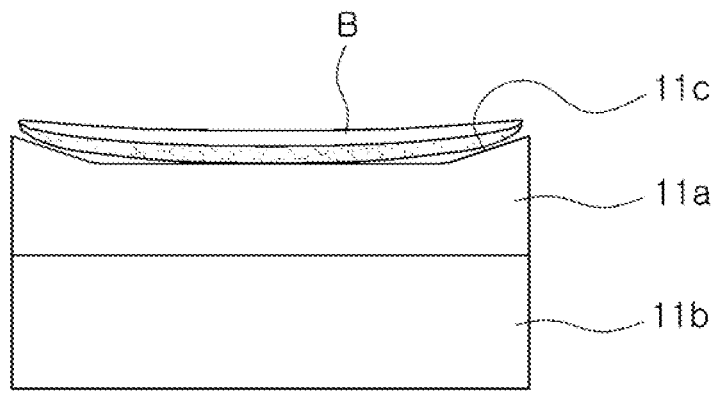
FIGS. 2A and 2B are cross-sectional views schematically illustrating a susceptor having a recess of FIG. 1, according to an example embodiment.
Figure 2B:
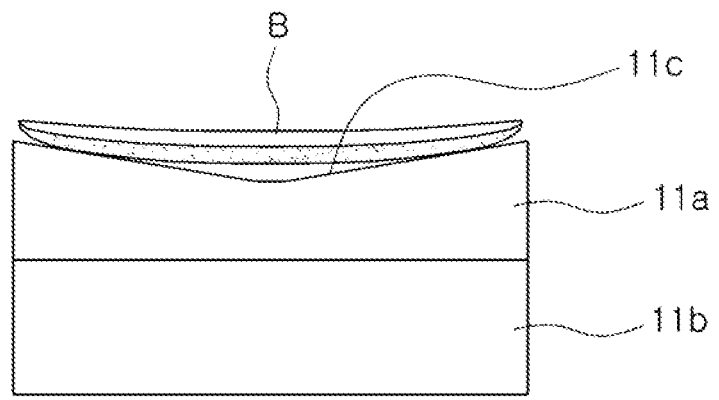

In FIGS. 2A and 2B, the susceptor 11a having a recess is schematically illustrated. As illustrated in FIGS. 2A and 2B, the support substrate B1 defining a bottom surface of the laminate structure B may be disposed in the recess 11c provided on one surface of the susceptor 11a. In other words, the laminate structure B including the support substrate B1, the semiconductor layer B2, and the growth substrate B3 may be disposed in the recess 11c of the susceptor 11a such that the support substrate B1 defines a bottom surface of the laminate structure B and the growth substrate B3 defines an upper surface of the laminate structure B.

The recess 11c of the susceptor 11a may have a U-shaped or V-shaped cross-section. The recess 11c may have a depth ranging from 50 μm to 150 μm with respect to a 4-inch wafer, for example. If a depth of the recess 11c is smaller than 50 μm, heat may not be uniformly applied to the growth substrate B3 overall. If a depth of the recess 11c is greater than 150 μm, a problem in terms of processing may arise.

When coefficients of thermal expansion of the growth substrate B3 and the support substrate B1 are different, the laminate structure B may bow. In this case, a focal point of a laser beam is changed during an LLO process, resulting in failure to accurately transmit energy to an interface between the growth substrate B3 and the semiconductor layer B2. Thus, when separating the growth substrate B3, the semiconductor layer B2, the growth substrate B3, and the support substrate B1 may be cracked or broken.

Such bowing may be alleviated by applying heat to the laminate structure B through the heater 11b. However, with respect to the related art susceptor having a flat structure, if a substrate has a high degree of bowing, an area thereof in contact with the susceptor is limited, making it somewhat difficult to evenly heat the substrate overall. Thus, the effect of alleviating bowing of the substrate is insignificant, compared to the case in which the substrate is equally heated overall.

In the present example embodiment, the susceptor 11a has the U-shaped or V-shaped recess 11c, increasing a contact area with the substrate, thus allowing the substrate to be evenly heated overall. Accordingly, bowing of the substrate may be alleviated, and thus, the problem of the related art that arises as a focal point of a laser beam is changed may be addressed.

The susceptor 11a may be formed of a material having excellent heat conductivity and being easily processed, such as aluminum, silicon carbide, graphite, or the like. However, the inventive concept is not limited thereto.

The laser irradiation unit 12 may be disposed above the support 11 to irradiate a laser beam L to the growth substrate B3 defining an upper surface of the laminate structure B.

The substrate separation device 20 separates the growth substrate B3 from the laminate structure B to which the laser beam L has been irradiated to the interface between the growth substrate B3 and the semiconductor layer B2 through the laser irradiation device 10. The growth substrate B3 may be physically completely separated from the laminate structure B by the substrate separation device 20.

Figure 3:
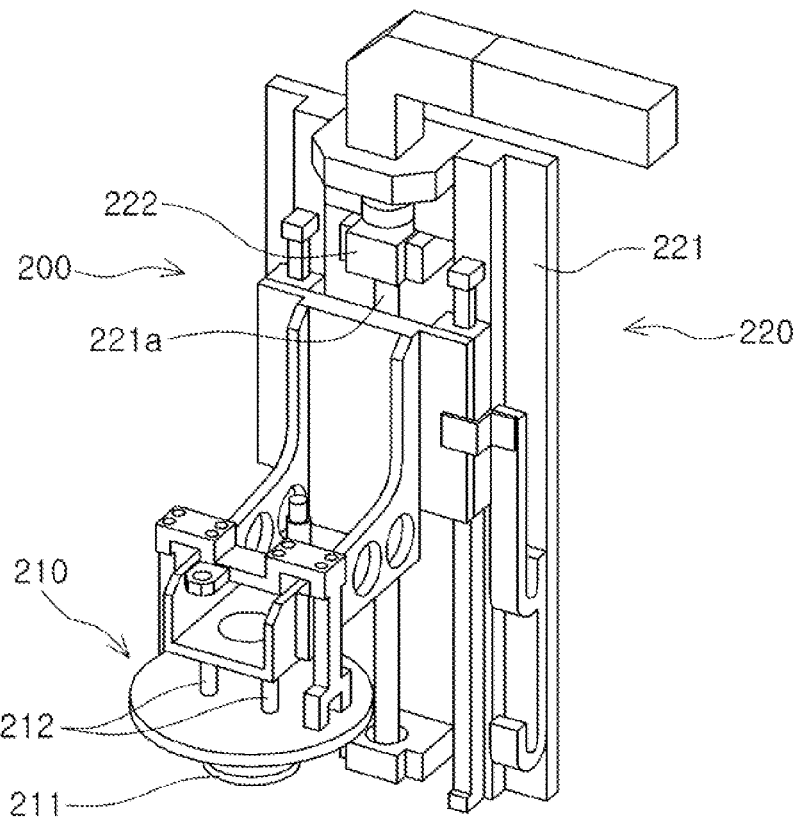
FIG. 3 is a perspective view schematically illustrating a substrate separation device, according to an example embodiment.
Figure 3:
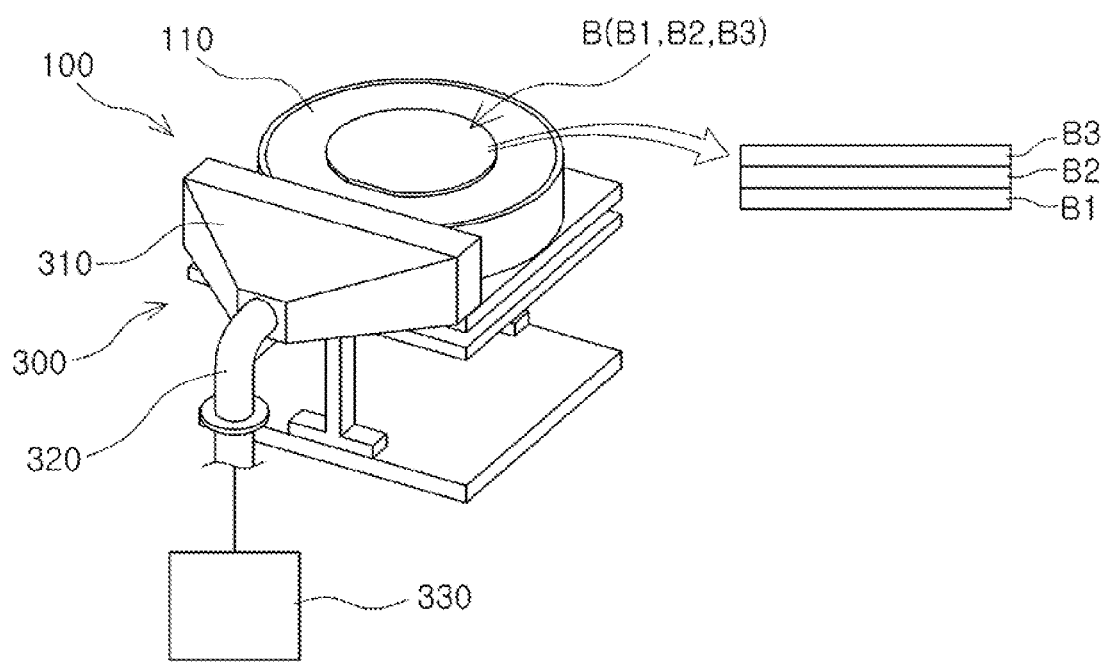

The substrate separation device 20 according to an example embodiment will be described with reference to FIG. 3. FIG. 3 is a perspective view schematically illustrating a substrate separation device according to an example embodiment.

Referring to FIG. 3, the substrate separation device 20 according to an example embodiment includes a first base 100 and a second base 200, and separates the growth substrate B3 from the laminate structure B including the support substrate B1, the semiconductor layer B2, and the growth substrate B3.

The laminate structure B may have a laminate structure in which the semiconductor layer B2 is interposed between the growth substrate B3 and the support substrate B1. The laminate structure B may be formed by epitaxially growing the semiconductor layer B2 on the growth substrate B3 through a chemical vapor deposition (CVD) apparatus such as CVD or metal-organic CVD (MOCVD) application, and subsequently bonding the support substrate B1 to the grown semiconductor layer B2.

In the present disclosure, terms such as "upper portion", "upper surface", "lower portion", "lower surface", "lateral surface", and the like, are determined based on the drawings, and in actuality, the terms may be changed according to a direction in which a structure is disposed.

A sapphire substrate, for example, may be used as the growth substrate B3. The semiconductor layer B2 stacked on the growth substrate B3 may include a first conductivity-type semiconductor layer, an active layer, and a second conductivity-type semiconductor layer sequentially stacked on the growth substrate B3.

The first conductivity-type semiconductor layer stacked on the growth substrate B3 may be an n-type nitride semiconductor layer doped with an n-type impurity. The second conductivity-type semiconductor layer may be a p-type nitride semiconductor layer doped with a p-type impurity. However, according to an example embodiment, the first and second conductivity-type semiconductor layers may be interchanged in position so as to be stacked. The first and second conductivity-type semiconductor layers may have an empirical formula $Al_xIn_yGa_{(1-x-y)}N$ (here, $0 \le x \le 1$, $0 \le y \le 1$, $0 \le x+y \le 1$), and, for example, materials such as GaN, AlGaN, InGaN, or AlInGaN may correspond thereto.

The active layer disposed between the first and second conductivity-type semiconductor layers may emit light having a predetermined level of energy through electron-hole recombination. The active layer may include a material having an energy band gap smaller than those of the first and second conductivity-type semiconductor layers. For example, in a case in which the first and second conductivity-type semiconductor layers are formed of a GaN-based compound semiconductor, the active layer may include an InGaN-based compound semiconductor having an energy band gap smaller than that of GaN. Also, the active layer may have a multi-quantum well (MQW) structure in which quantum barrier layers and quantum well layers are alternately stacked. For example, an InGaN/GaN structure. However, the inventive concept is not limited thereto and the active layer may have a single quantum well (SQW) structure.

As the support substrate B1 bonded to the semiconductor layer B2, for example, a silicon substrate may be used. However, the inventive concept is not limited thereto and Ge, SiAl, or any other substrate having a coefficient of thermal expansion similar to that of the semiconductor layer may also be used as the support substrate B1. The support substrate B1 may be bonded to the semiconductor layer B2 through a bonding metal.

The laminate structure B may be fixedly disposed on the first base 100. In this case, the laminate structure B may be disposed such that the support substrate B1 defines a bottom surface of the laminate structure B.

Figure 4A:
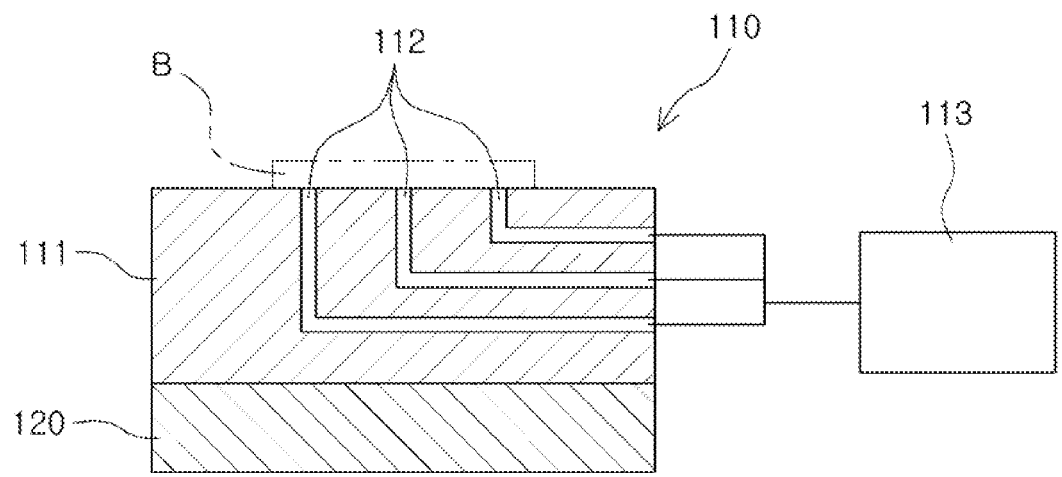
FIGS. 4A and 4B are a cross-sectional view and a plan view schematically illustrating a first grip unit of FIG. 3, respectively, according to an example embodiment.
Figure 4B:
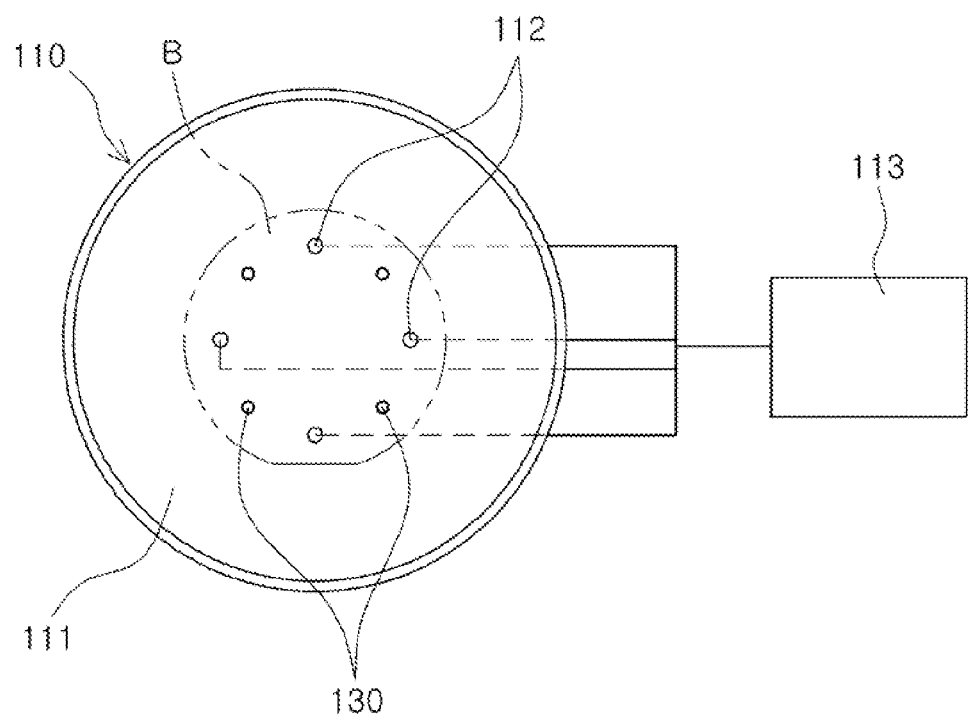
Figure 5:
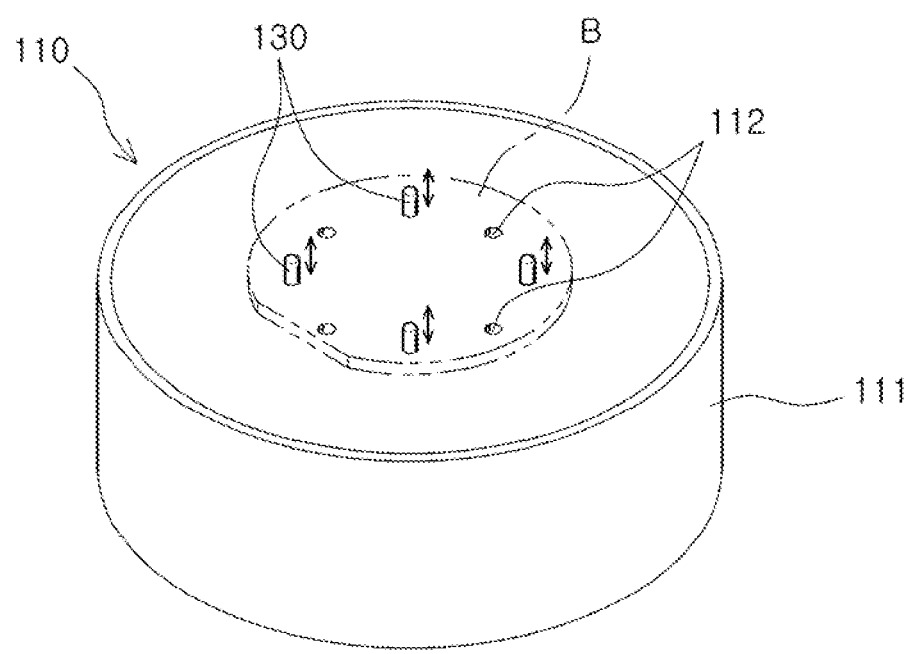
FIG. 5 is a perspective view schematically illustrating a structure having lift pins in FIG. 4B, according to an example embodiment.

FIGS. 4A, 4B, and 5 schematically illustrate a configuration and structure of the first base.

As illustrated in FIGS. 4A and 4B, the first base 100 may include a first holding unit 110 holding the support substrate B1 defining a bottom surface of the laminate structure B and a heating unit 120 heating the laminate structure B to have a predetermined temperature.

The first holding unit 110 may selectively hold the support substrate B1 through vacuum adsorption. The first holding unit 110 may include a body 111 on which the laminate structure B is disposed, a plurality of vacuum nozzles 112 exposed to a surface of the body 111, and a pump 113 connected to the plurality of vacuum nozzles 112. The first holding unit 110 may selectively hold the support substrate B1 through selective vacuum adsorption according to an operation of the pump 113. The first holding unit 110 may be a sort of vacuum chuck.

The heating unit 120 may heat the laminate structure B held by the first holding unit 110 to have a predetermined temperature, for example, a temperature ranging from 150° C. to a melting point of the bonding metal. For example, the heating unit 120 may heat the laminate structure B to have a temperature ranging from 150° C. to 500° C., preferably, from 200° C. to 280° C. The heating unit 120 may be a type of heat transfer member generating heat when power is applied, but the inventive concept is not limited thereto.

As illustrated in FIG. 5, the first base 100 may further include a plurality of lift pins 130 separating the laminate structure B from the first holding unit 110. The plurality of lift pins 130 may move in a vertical direction within the body 111 to partially protrude from an upper surface of the body 111. Lifted from the body 111, the laminate structure B may be separated from the first holding unit 110.

The second base 200 may include a second holding unit 210 disposed above the first holding unit 110 and holding the growth substrate B3 defining an upper surface of the laminate structure B and a moving unit 220 connected to the second holding unit 210 and moving the second holding unit 210 in a vertical direction.

Figure 6:
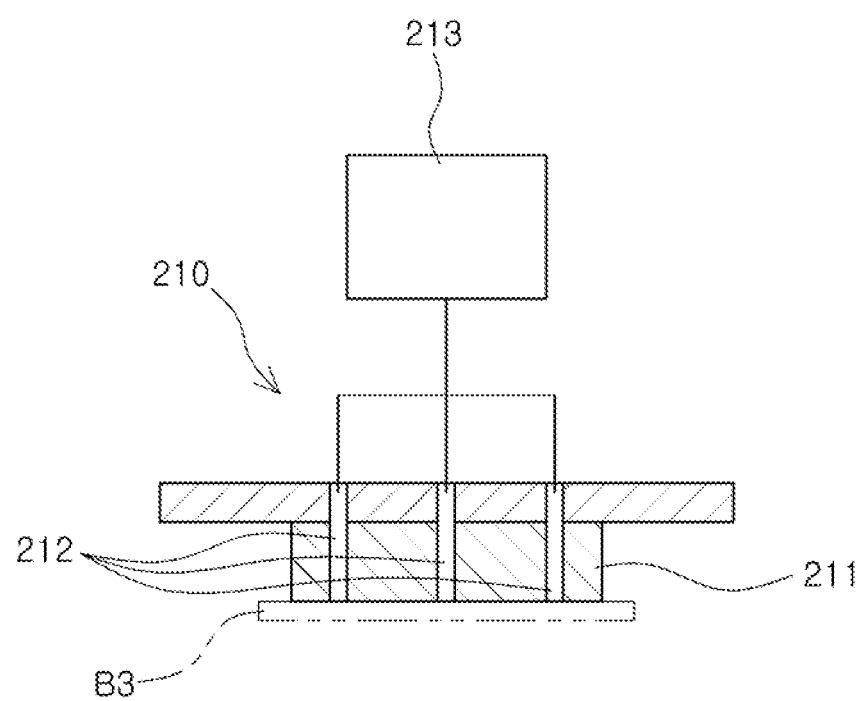
FIG. 6 is a cross-sectional view schematically illustrating a second grip unit of FIG. 3, according to an example embodiment.

The second holding unit 210 may selectively hold the growth substrate B3 through vacuum adsorption. FIG. 6 schematically illustrates the second holding unit 210.

As illustrated in FIG. 6, the second holding unit 210 may include a vacuum pad 211 that comes into contact with the growth substrate B3, nozzles 212 exposed to a surface of the vacuum pad 211, and a pump 213 connected to the nozzles 212. The second holding unit 210 may selectively hold the growth substrate B3 through selective vacuum adsorption according to an operation of the pump 213.

The moving unit 220 may include a frame unit 221 having a guide 221a fastened to the second holding unit 210 to guide a movement of the second holding unit 210 and a driving unit 222 generating driving force enabling the second holding unit 210 to move along the guide 221a from one end of the frame unit 221.

The frame unit 221 may have a structure extending to an upper portion of the first base 100, and the guide 221a may have a structure extending in a vertical direction perpendicular to the first holding unit 110. The second holding unit 210 may be fastened to the frame unit 221 and reciprocate in a vertical direction along the guide 221a.

The driving unit 222 may be provided in one end of the frame unit 221 and generates driving force enabling the second holding unit 210 to move upwardly and downwardly along the guide 210a. In the drawing, it is illustrated that the driving unit 222 is provided in an upper end portion of the frame unit 221, but the inventive concept is not limited thereto. The driving unit 222 may include, for example, a motor or a hydraulic cylinder unit, and any means may be used as the driving unit 222 as long as it may enable the second holding unit 210 to reciprocate up and down.

An exhaust unit 300 may be disposed at one side of the first base 110 to discharge foreign objects generated when the growth substrate B3 is separated. The exhaust unit 300 may include an exhaust hood 310 open toward the first base 110, an exhaust pipe 320 communicating with the exhaust hood 310, and an exhaust pump 330 generating an air stream drawing in foreign objects through the exhaust pipe 320.

A foreign object generated when the growth substrate B3 is separated may be introduced to the exhaust hood 310 in an air stream generated by the exhaust pump 330 and discharged outwardly through the exhaust pipe 320.

Figure 7:
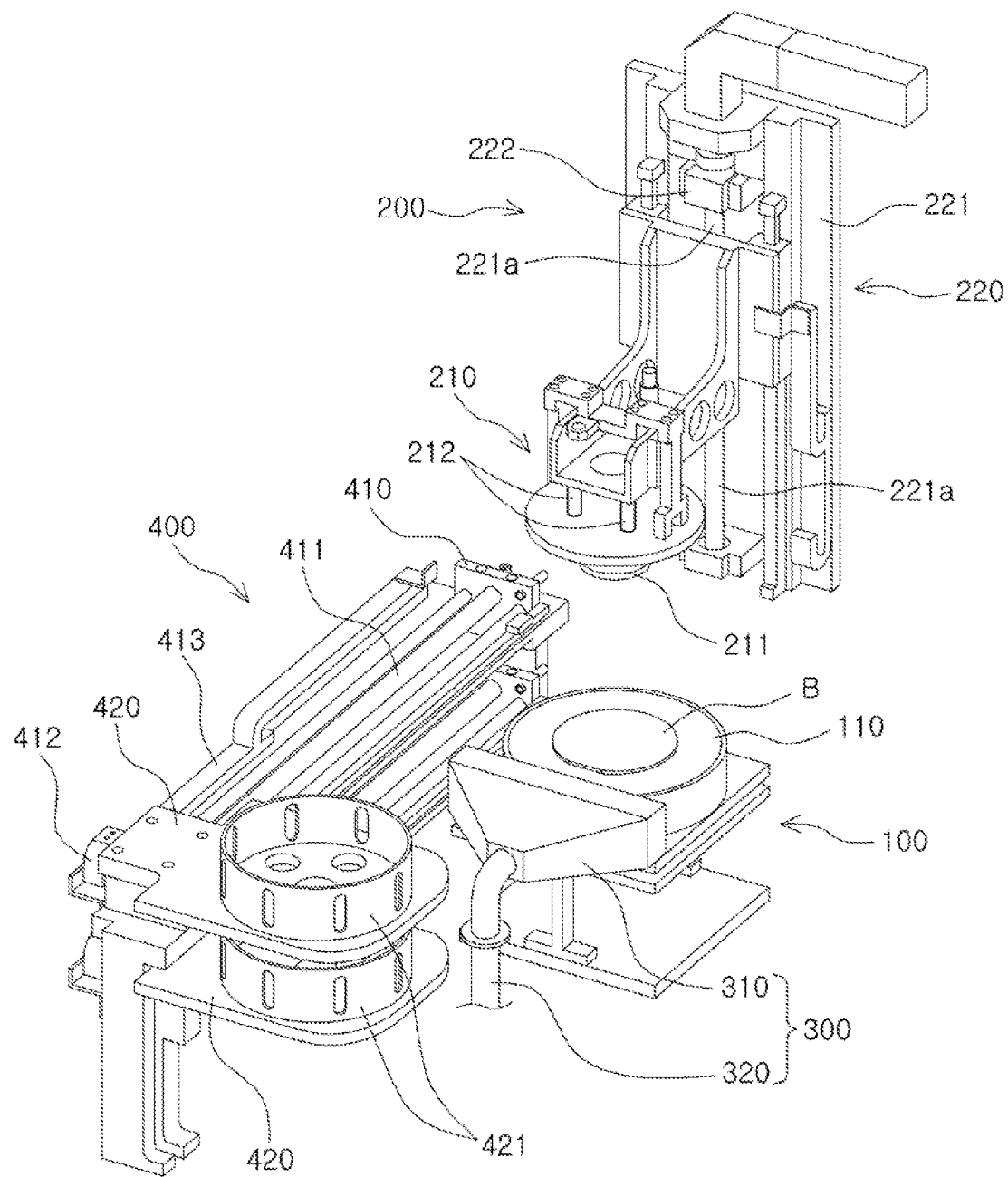
FIG. 7 is a perspective view schematically illustrating a structure in which the substrate separation device of FIG. 3 further includes a receiving unit, according to an example embodiment.

FIG. 7 schematically illustrates a structure in which the substrate separation device 200 of FIG. 3 further includes a receiving unit. As illustrated in FIG. 7, a receiving unit 400 may be further provided beside the first base 110 to receive the growth substrate B3 separated from the laminate structure B.

The receiving unit 400 may include a support frame 410 and a moving plate 420 fastened to the support frame 410 such that the moving plate 420 reciprocates. The receiving unit 400 may be selectively provided. In other words, according to an example embodiment, the receiving unit 400 may be omitted. In the present example embodiment, the structure including the receiving unit 400 will be described.

The support frame 410 may include a transfer rail 411 extending in a longitudinal direction of the support frame 410, a driving motor 412 provided in the transfer rail 411, and a driving belt 413 extending along the transfer rail 411 and connected to the driving motor 412 so as to be rotatably driven.

The moving plate 420 is supportedly fastened to the transfer rail 411, connected to the driving belt 413, and reciprocating along the transfer rail 411 by rotational driving of the driving belt 413. The moving plate 420 may have a receiving basket 421 in which the growth substrate B3 is received and disposed.

In the present example embodiment, it is illustrated that the moving plate 420 reciprocates according to rotation of the driving belt 413 extending along the transfer rail 411, but the inventive concept is not limited thereto. For example, the moving plate 420 may be connected to a piston connected to the hydraulic cylinder and reciprocate along the transfer rail 411 as the piston reciprocates.

Operations of the first base 100, the second base 200, the exhaust unit 300, and the receiving unit 400 may be controlled by a controller (not shown). The controller may include, for example, a programmable logic controller (PLC).

The operation of the foregoing substrate separation device 20 will be briefly described.

As illustrated in FIGS. 3 and 7, the laminate structure B, including the support substrate B1, the semiconductor layer B2, and the growth substrate B3, and to which a laser beam has been irradiated to the interface between the growth substrate B3 and the semiconductor layer B2 during an LLO process, may be disposed on the first holding unit 110 of the first base 100 such that the support substrate B1 of the laminate structure B forms a bottom surface of the laminate structure B facing the surface of the body 111 of the holding unit 110.

When the laminate structure B is disposed on the body 111 of the first holding unit 110, the pump 113 connected to the vacuum nozzles 112 exposed to a surface of the body 111 is actuated as illustrated in FIG. 4A. The laminate structure B may be fixedly held by the first holding unit 110 through vacuum adsorption.

With the laminate structure B held by the first holding unit 110, the heating unit 120 heats the laminate structure B to have a predetermined temperature, for example, a temperature ranging from 150° C. to a melting point of a bonding metal.

Heating the laminate structure B to a high temperature may prevent a portion from remaining undecomposed or unmelted because a laser beam does not reach the interface between the growth substrate B3 and the semiconductor layer B2 due to a defect of a focal point, contamination of a surface of the growth substrate, or the like, during laser beam irradiation. In other words, if a portion remains undecomposed in the interface (for example, the first conductivity-type semiconductor layer or the buffer layer), it is heated to a high temperature so as to be decomposed or separated.

Figure 8:
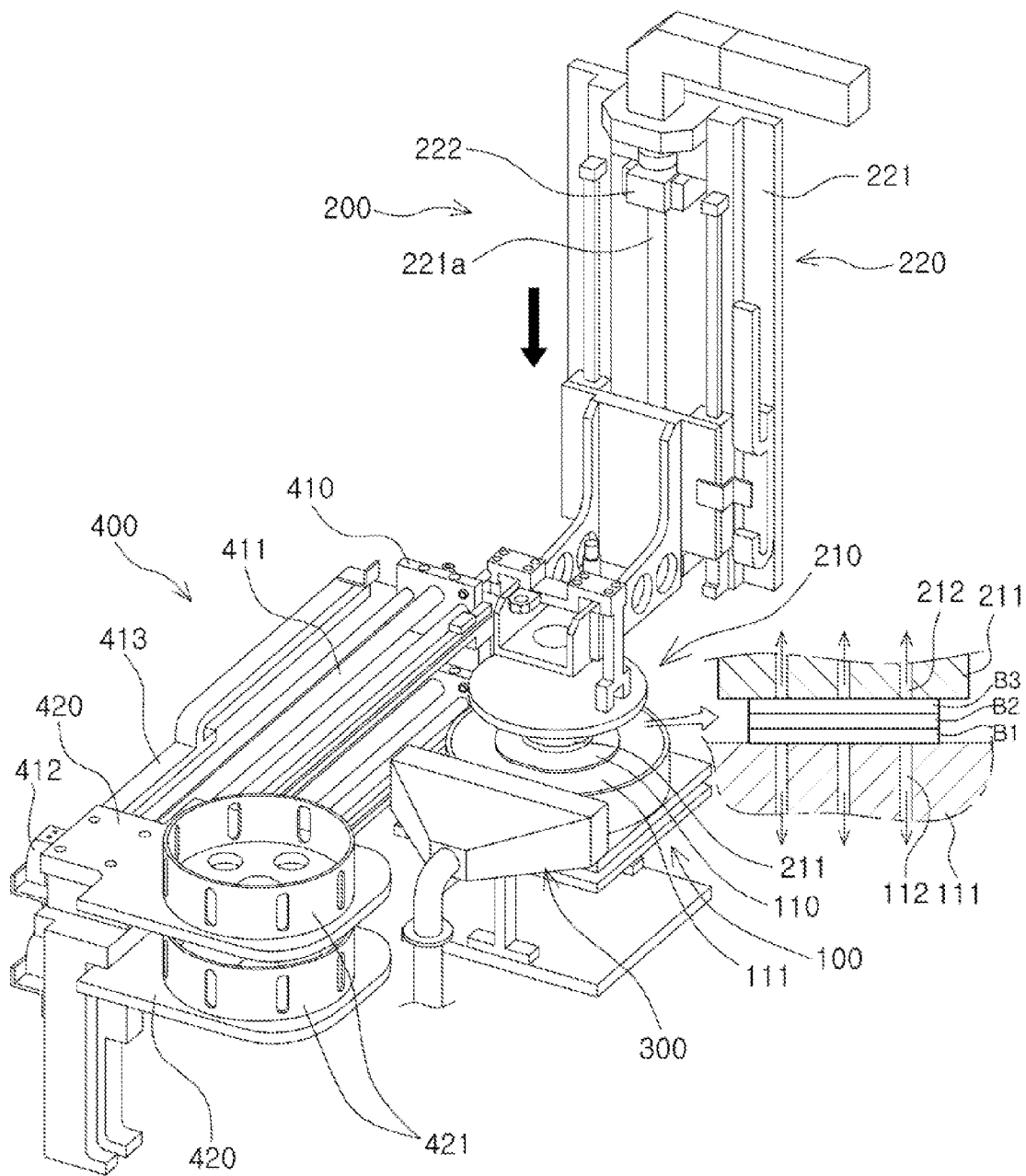
FIGS. 8 through 10 are perspective views schematically illustrating operations of the substrate separation device in stages, according to an example embodiment.

Referring to FIG. 8, the second holding unit 210 of the second base 200 moves downwardly along the guide 221a of the frame unit 221 by the driving unit 222 to attach the vacuum pad 211 to the growth substrate B3. The second holding unit 210 subsequently vacuum-adsorbs the growth substrate B3 through actuation of the pump 213.

Figure 9:
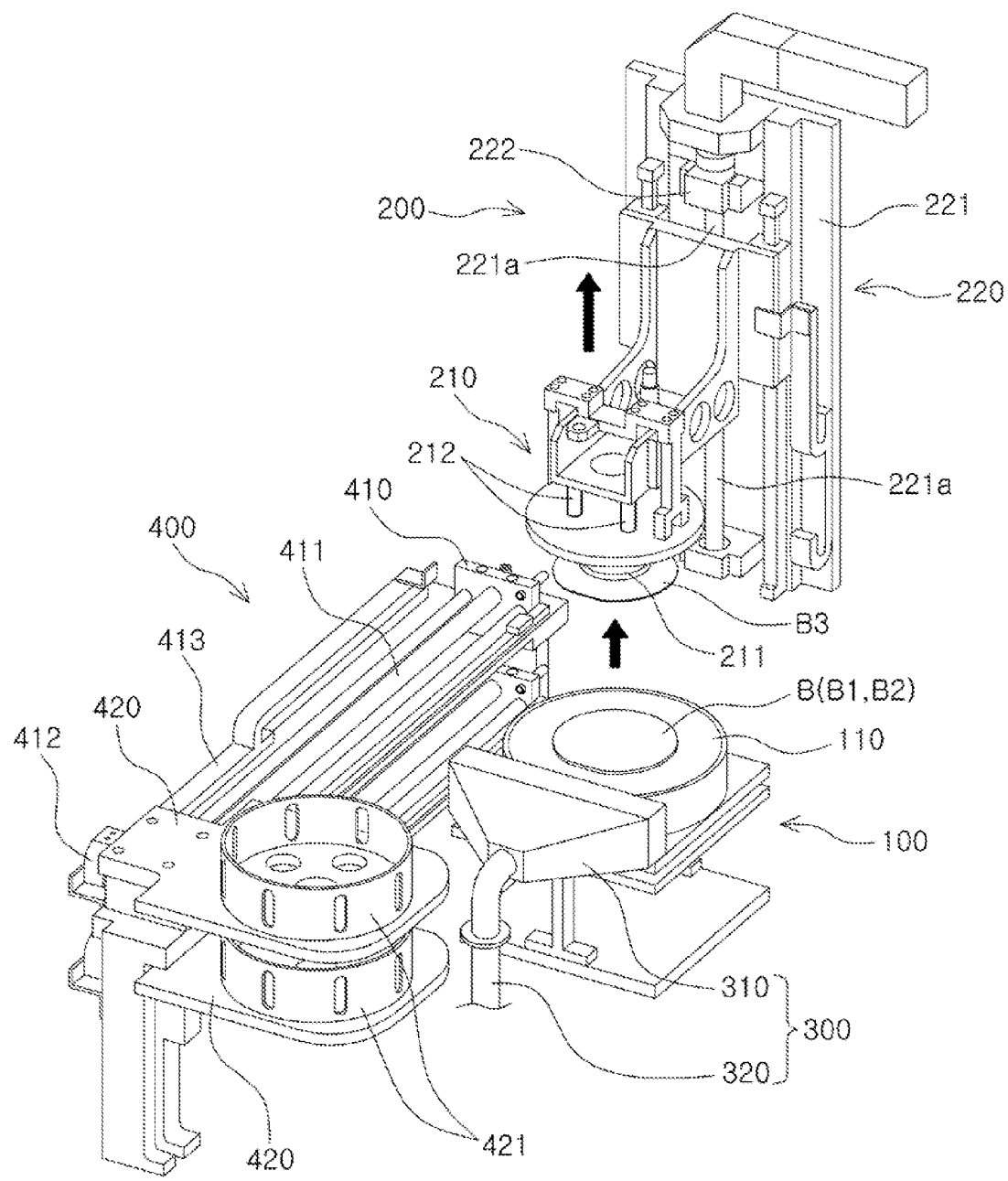

As illustrated in FIG. 9, with the growth substrate B3 held through vacuum adsorption, the second holding unit 210 moves back upwardly along the guide 221a of the frame unit 221 by the driving unit 222, and the growth substrate B3 held by the second holding unit 210 moves upwardly by the second holding unit 210 and physically separated from the interface with the semiconductor layer B2 according to continuous movement of the second holding unit 210.

Here, foreign objects such as a fragment, or the like, may be outwardly discharged through the exhaust unit 300. Thus, the device, the semiconductor layer, the growth substrate, the support substrate, and the like, may be prevented from being contaminated by foreign objects.

Figure 10:
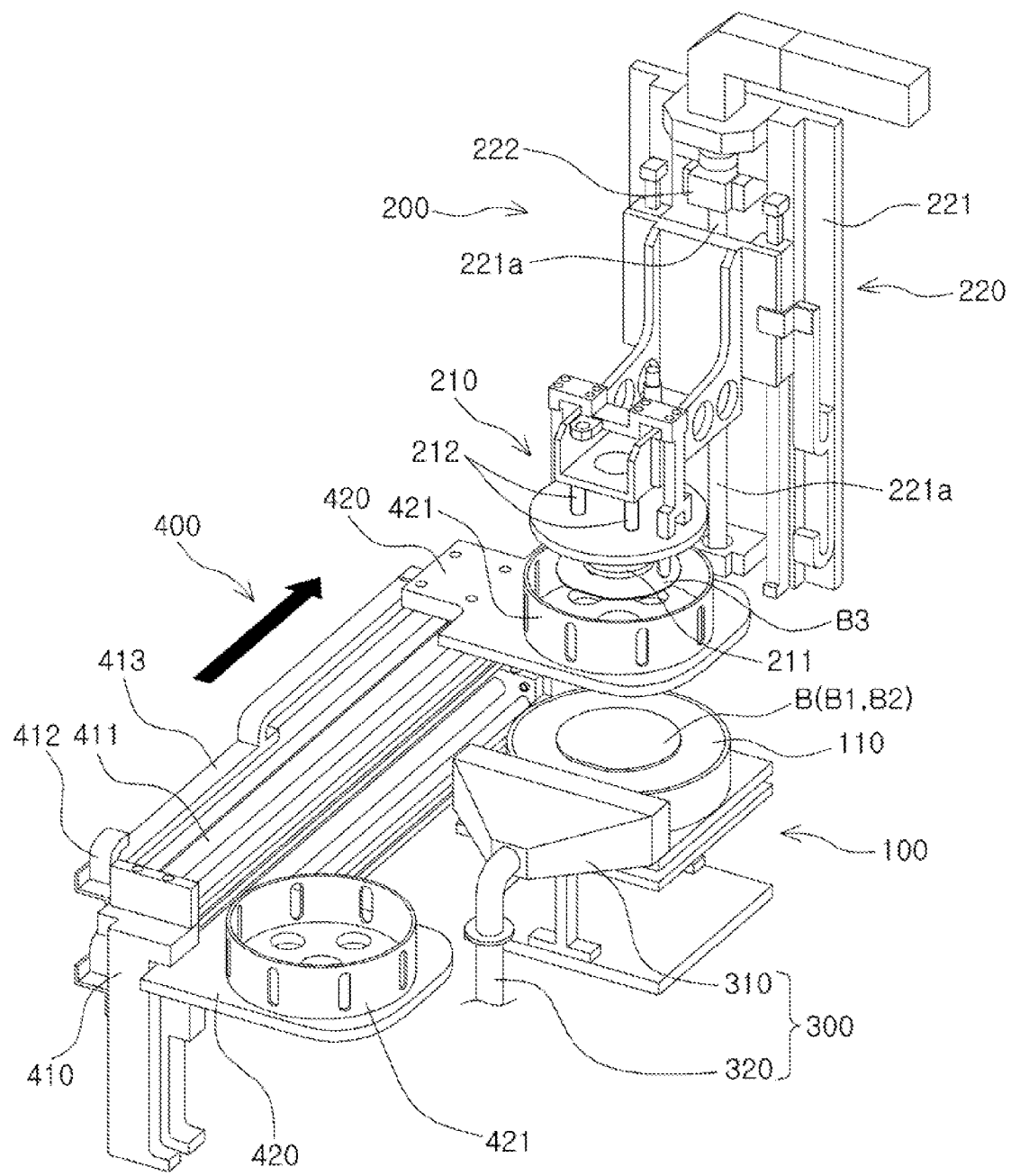

When the growth substrate B3 is separated from the semiconductor layer B2 and moved upwardly from the first holding unit 110 by the second holding unit 210, the moving plate 420 with the receiving basket 421 may be transferred along the transfer rail 411 and disposed in a position between the first holding unit 110 and the second holding unit 210 as illustrated in FIG. 10.

The second holding unit 210 determines that the moving plate 420 is positioned therebelow, stops actuating the pump or actuates the pump in a reverse manner to that of the vacuum adsorption to put down the growth substrate B3 held by the vacuum pad 211 to the interior of the receiving basket 421.

When the growth substrate B3 is received within the receiving basket 421, the moving plate 420 is transferred back to the original position along the transfer rail 411. The separated growth substrate B3 received within the receiving basket 421 may be transferred to a device such as a cleaning device afterwards and undergo a reproducing process so as to be recycled.

After the growth substrate B3 is separated, the first holding unit 110 stops actuating the pump or actuates the pump in a reverse manner to that of the vacuum adsorption, and thus, the laminate structure B including the support substrate B1 and the semiconductor B2, without being held by the first holding unit 110, may be disposed on the body 111.

When the support substrate B1 is lifted from the body 111 according to actuation of the lift pin 130, the support substrate B1 with the semiconductor layer B2 attached to one surface thereof is unloaded from the first holding unit 110 through a hand, or the like, connected to a robotic arm (not shown).

In this manner, in separating the growth substrate B3 through vacuum adsorption, the substrate separation device 20 according to the present example embodiment heats the laminate structure to a high temperature of 200° C. or higher, and separate the laminate structure B at the high temperature state, unlike the related art scheme of simply separating a laminate structure in a room temperature state.

If a laser beam fails to irradiate to the interface between the growth substrate and the semiconductor layer due to a defective or contaminated growth substrate during an LLO process, the semiconductor layer or the buffer layer, which has not been decomposed (vaporized) by the laser beam, may remain in the interface. The remaining undecomposed (unvaporized) semiconductor layer or buffer layer may cause the growth substrate including the semiconductor layer or the support substrate to be cracked or broken in the process of separating the growth substrate by force after the laser beam irradiation.

Thus, in the present example embodiment, in separating the growth substrate after the laser irradiation, the growth substrate is heated to a high temperature, rather than remaining in a room temperature state, to eliminate a possibility of remaining semiconductor layer or buffer layer in advance, thus preventing the substrate from being cracked or broken.

Hereinafter, a method of manufacturing a semiconductor light emitting device using the substrate separation system as described above will be described.

Figure 14A:
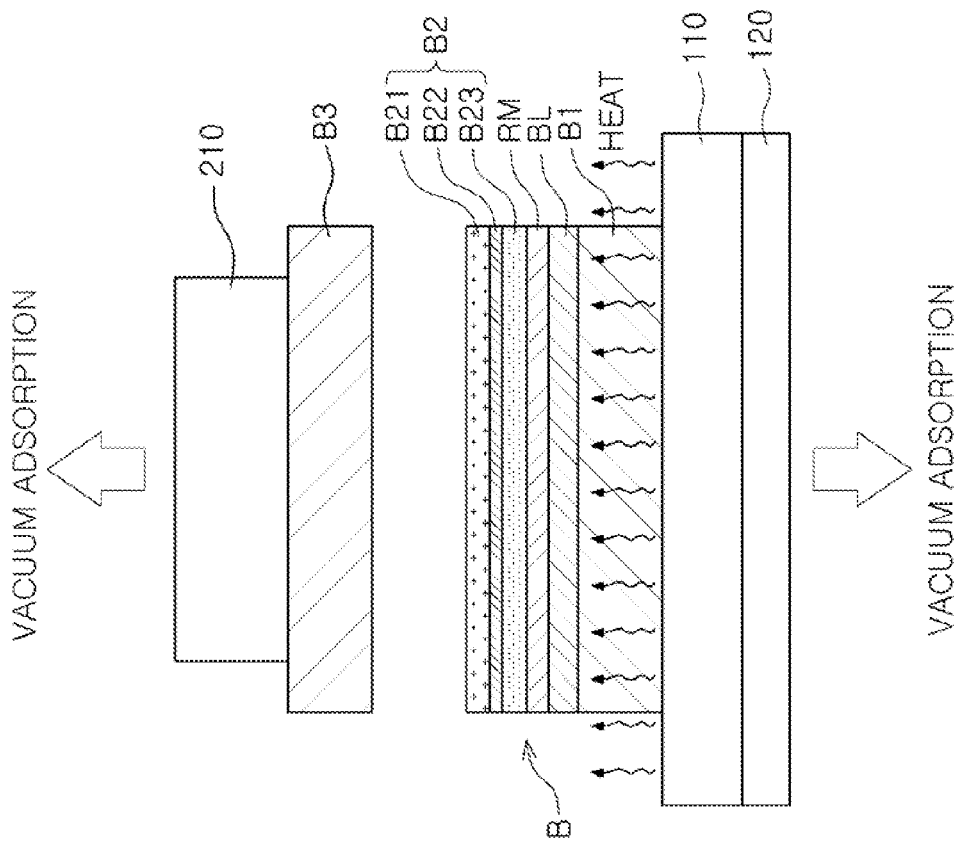
Figure 14B:
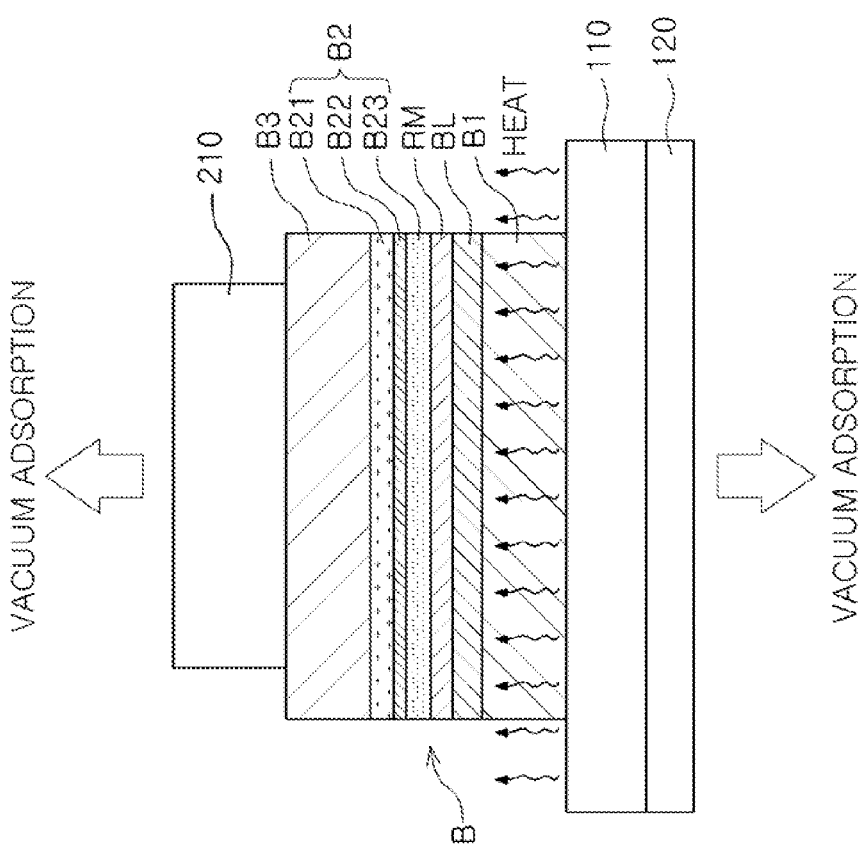
Figure 15:
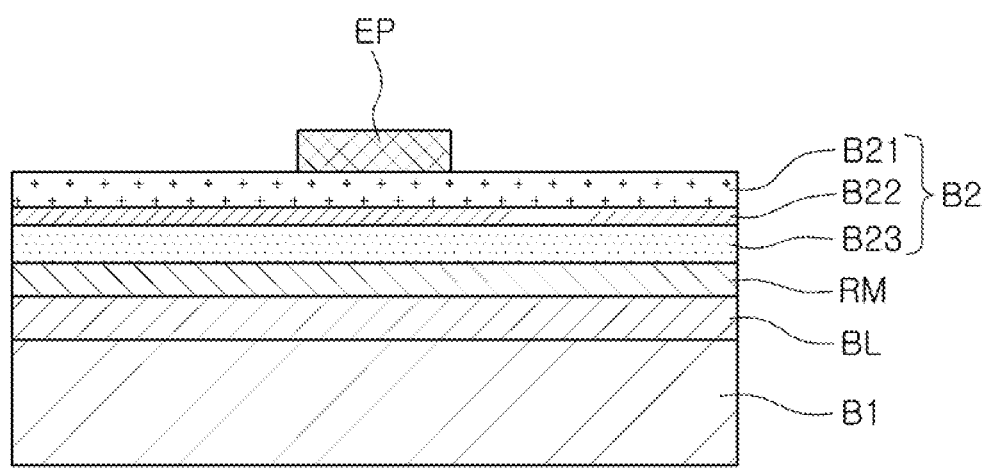
Figure 16:
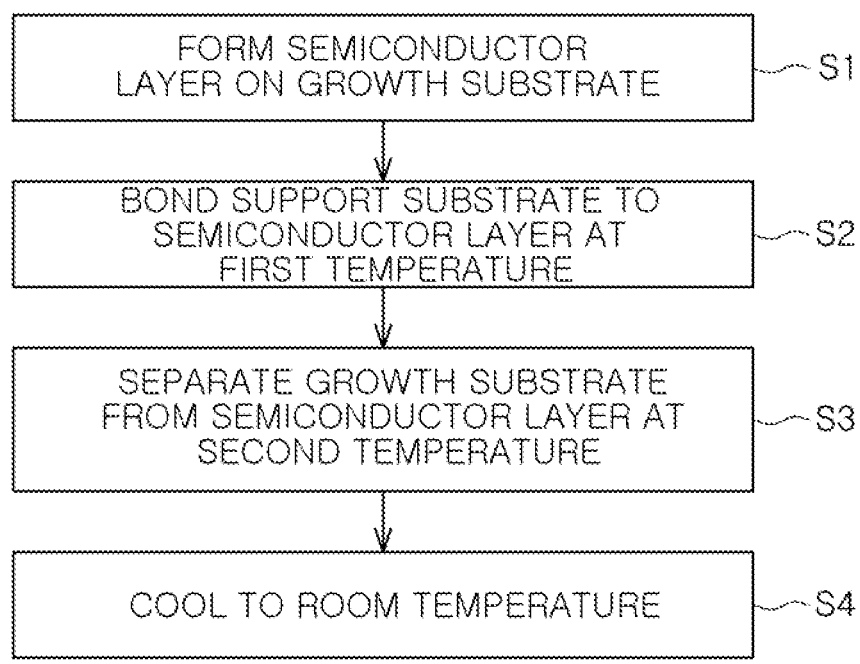
FIG. 16 is a flow chart illustrating a process of manufacturing a semiconductor light emitting device, according to an example embodiment.

FIGS. 11 through 15 are cross-sectional views schematically illustrating sequential processes of a method of manufacturing a semiconductor light emitting device according to an example embodiment, and FIG. 16 is a flow chart illustrating a process of manufacturing a semiconductor light emitting device according to an example embodiment.

Figure 11:
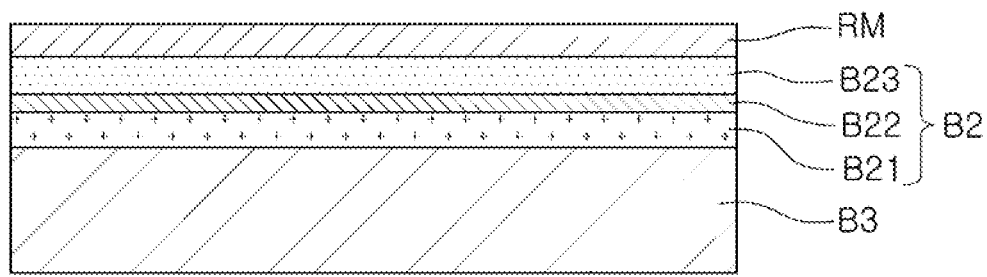
FIGS. 11 through 15 are cross-sectional views schematically illustrating sequential processes of a method of manufacturing a semiconductor light emitting device, according to an example embodiment.

Referring to FIGS. 11 and 16, a method of manufacturing a semiconductor light emitting device according to the present example embodiment may include operation S1 of forming a semiconductor layer B2 on a growth substrate B3. Here, the semiconductor layer B2 may be a structure including an active layer B22 emitting light and first and second conductivity-type semiconductor layers B21 and B23 disposed above and below the active layer B22, respectively.

The growth substrate B3 may be used as a substrate for growing the semiconductor layer B2, and a sapphire substrate may be typically used as the growth substrate B3. Of course, a substrate formed of SiC, GaN, ZnO, $MgAl_2O_4$, MgO, $LiAlO_2$, $LiGaO_2$, or the like, may also be used as the growth substrate B3, according to circumstances.

Referring to the structure of the semiconductor layer B2, the first and second conductivity-type semiconductor layers B21 and B23 and the active layer B22 disposed therebetween may be formed of a Group III-V nitride semiconductor, for example, a material having a composition of $Al_xIn_yGa_{1-x-y}N$ ($0 \leq x \leq 1$, $0 \leq y \leq 1$, $0 \leq x+y \leq 1$), or may be formed of GaN, AlGaN, InGaN, AlInGaN-based material. Also, the first and second semiconductor layers B21 and B23 may be respectively doped with n-type and p-type impurities. The active layer B22 disposed between the first and second semiconductor conductivity-type semiconductor layers B21 and B23 may emit light having a predetermined level of energy according to electron-hole recombination and may have a multi-quantum well (MQW) structure in which quantum well layers and quantum barrier layers are alternately laminated. However, the inventive concept is not limited thereto and the active layer may have a single quantum well (SQW) structure.

The first and second conductivity-type semiconductor layers B21 and B23 and the active layer B22 may be grown through a process known in the art, such as metal-organic chemical vapor deposition (MOCVD), hydride vapor phase epitaxy (HVPE), molecular beam epitaxy (MBE), or the like. Also, although not shown, before the first conductivity-type semiconductor layer B21 is formed on the growth substrate B3, a buffer having various structures (crystalline, amorphous, and the like) may be formed to enhance crystallinity of the first conductivity-type semiconductor layer. For example, an undoped GaN layer may be formed as a buffer layer.

In general, in a case in which the semiconductor layer B2 is grown at a temperature of approximately 1000° C. on the growth substrate B3 and cooled to room temperature, stress is generated in the semiconductor layer B2 due to a difference in lattice constants and coefficients of thermal expansion between the growth substrate B3 and the semiconductor layer B2. Namely, when a coefficient of thermal expansion of the growth substrate B3 is greater than that of the semiconductor layer B2, compressive stress may be generated in the semiconductor layer B2, and if the coefficient of thermal expansion of the growth substrate B3 is lower than that of the semiconductor layer B2, tensile stress may be generated in the semiconductor layer B2.

In an example embodiment, for example, in a case in which the semiconductor layer B2, which includes the GaN-based first and second conductivity-type semiconductor layers B21 and B23 and the active layer B22 including InGaN, is grown on the growth substrate B3, which is a sapphire substrate, at a high temperature ranging from approximately 800° C. to 1200° C. and cooled to room temperature, since the coefficient of thermal expansion of the growth substrate B3 is greater than that of the semiconductor layer B2, compressive stress may be generated in the semiconductor layer B2 including the active layer B22. Also, the InGaN layer constituting the active layer B22 having a quantum well structure has compressive stress additionally generated due to a difference in lattice constants between the InGaN layer and the first and second conductivity-type semiconductor layers B21 and B23, and such compressive stress may form piezoelectric polarization within the quantum well structure to deform an energy band structure and degrade internal quantum efficiency.

For reference, a coefficient of thermal expansion of sapphire is approximately $7.5 \times 10^{-6}$/K and that of the GaN-based semiconductor is approximately $5.6 \times 10^{-6}$/K. A lattice constant of GaN is 3.189 Å (a-axis) and 5.185 Å (c-axis), and in case of InGaN, a lattice constant thereof is increased as the content of indium (In) is increased.

Thereafter, a reflective metal layer RM may be formed on the semiconductor layer B2. The reflective metal layer RM may be formed of a metal having electrically ohmic-characteristics with respect to the second conductivity-type semiconductor layer B23 and having a high level of reflectivity. In consideration of this function, the reflective metal layer RM may be formed to include a material such as Ag, Ni, Al, Rh, Pd, Ir, Ru, Mg, Zn, Pt, Au, or the like. The reflective metal layer RM may be formed by depositing, such as sputtering, or the like, such a metal. In the present example embodiment, the reflective metal layer RM serves to provide a more advantageous effect, rather than being essential, and thus, the reflective metal layer RM may be excluded according to circumstances.

Figure 12A:
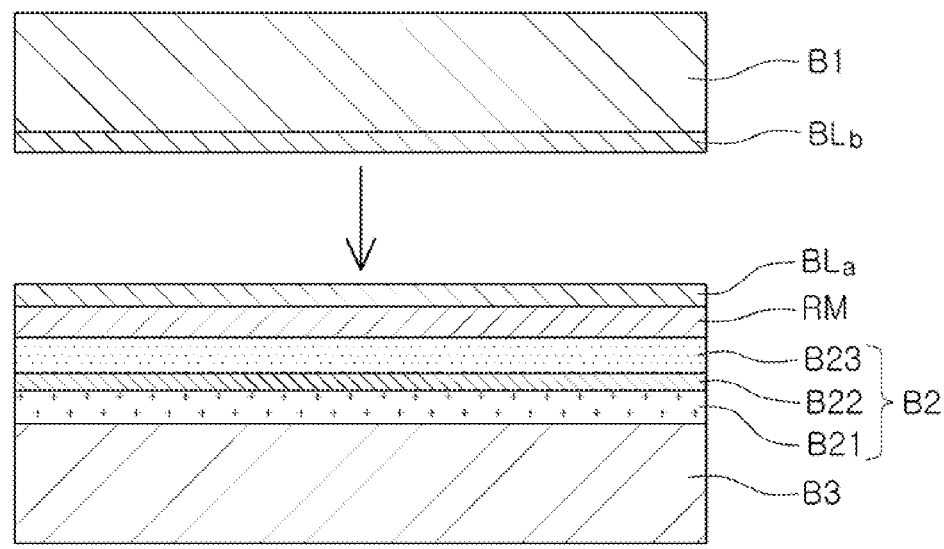
Figure 12B:
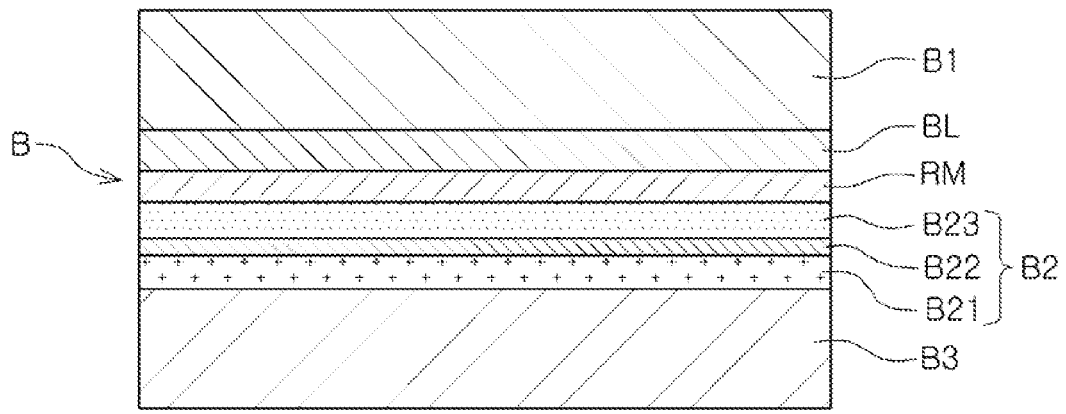
Figure 13:
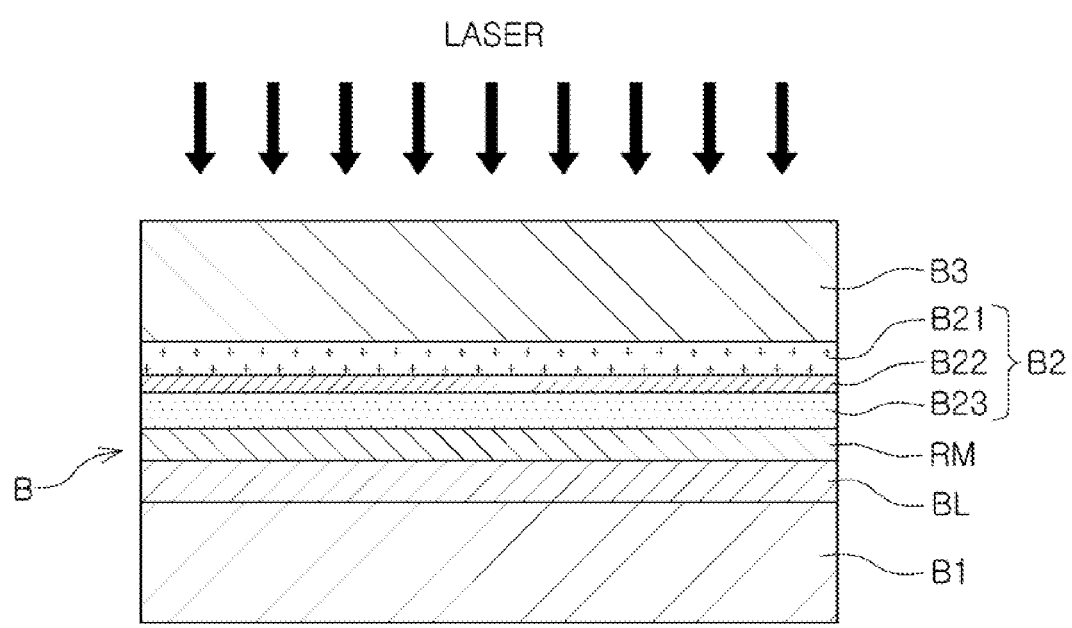

Referring to FIGS. 12A, 12B, and 16, operation S2 of bonding the support substrate B1 to the semiconductor layer B2 may be performed.

The support substrate B1 may serve as a support supporting the semiconductor layer B2 during a process of removing the growth substrate B3, or the like. Also, in a case in which the support substrate B1 is formed of a conductive material, the support substrate B1 may be connected to an external power source to apply an electrical signal to the second conductivity-type semiconductor layer B23.

As described above, in the present example embodiment, for example, in the case in which the semiconductor layer B2 formed of a GaN-based semiconductor material is formed on the growth substrate B3, which is a sapphire substrate, luminous efficiency, specifically, internal quantum efficiency, of a light emitting device may be degraded due to compressive stress generated within the semiconductor layer B2, in particular, within the active layer B22 as a light emitting unit. Thus, in order to alleviate such stress during a follow-up cooling process as described hereinafter, the support substrate B1 may be selectively formed of a material having a coefficient of thermal expansion lower than that of the active layer B22 to exert tensile stress on the active layer B22.

In this respect, the support substrate B1 may be formed of any one of materials among Si, SiC, GaP, InP, AlN, and graphite, and coefficients of thermal expansion of these materials are respectively $3.59 \times 10^{-6}$/K, $4.2 \times 10^{-6}$/K, $4.65 \times 10^{-6}$/K, $4.6 \times 10^{-6}$/K, $4.15 \times 10^{-6}$/K, and $3.0 \times 10^{-6}$/K. Also, in order to exert tensile stress on the semiconductor layer B2 including the active layer B22, the support substrate B1 may have a thickness sufficiently greater than that of the semiconductor layer B2. Besides, a support substrate formed of SiAl or Ge having a coefficient of thermal expansion similar to that of the semiconductor layer may also be used.

Conversely, if tensile stress is exerted on the semiconductor layer B2, the support substrate B1 may be formed of a material having a coefficient of thermal expansion greater than that of the active layer B22 in order to alleviate the tensile stress.

The process of bonding the support substrate B1 will be described in detail. First, as illustrated in FIG. 12A, a first bonding material layer BLa may be formed on the reflective metal layer RM, and a second bonding material layer BLb may be formed on the support substrate B1. The first and second bonding material layers BLa and BLb may be formed through e-beam evaporation, chemical or physical vapor deposition, or the like. According to an example embodiment, the first bonding material layer BLa may be formed directly on the semiconductor layer B2. Also, although not shown, a diffusion barrier layer may be formed between the support substrate B1 and the second bonding material layer BLb in order to prevent diffusion of a metal.

Next, as illustrated in FIG. 12B, the facing first and second bonding material layers BLa and BLb may be melted at a first temperature higher than room temperature to form a bonding layer BL to bond the support substrate B1 to semiconductor layer B2. In this case, in order to facilitate the bonding, pressure may be applied. Accordingly, the laminate structure B including the support substrate B1, the semiconductor layer B2, and the growth substrate B3 may be formed.

In the related art, a bonding metal having a relatively low eutectic temperature is used as the bonding material to minimize bowing or distortion of a substrate during a cooling process to room temperature after bonding, but in the present example embodiment, an alloy having a relatively high eutectic temperature of 200° C. or higher may be used as the bonding material.

When the first temperature, a temperature for bonding the support substrate B1, is high, a second temperature during a process of separating the growth substrate B3 as described hereinafter may be increased, which may resultantly increase an effect of alleviating stress due to difference in coefficients of thermal expansion between the support substrate B1 and the active layer B22 during a process of performing cooling to room temperature after the separation. Thus, as a material of the bonding layer BL, an NiSn alloy, an AuSn alloy (eutectic temperature: approximately 280° C., an AuGe alloy (eutectic temperature: approximately 350° C.), an AuSi alloy (eutectic temperature: approximately 380° C.), or the like, may be used. Since bonding is performed at a relatively high first temperature, the light emitting device may be heat-treated at a high temperature in a follow-up process, and thus, quality and operation stability of the light emitting device may be enhanced.

Thereafter, referring to FIGS. 13, 14A-14B and 16, operation S3 of separating the growth substrate B3, used for growing the nitride semiconductor layers, from the semiconductor layer B2 may be performed through a laser lift-off (LLO) scheme.

The laminate structure B may be disposed on the support 11 of the laser irradiation device 10 such that the support substrate B1 defines a lower surface of the laminate structure B and the growth substrate B3 defines an upper surface thereof. Thereafter, the laser irradiation unit 12 irradiates a laser beam L to the growth substrate B3.

When a laser beam L is irradiated toward the growth substrate B3, since the growth substrate B3 is a light-transmissive substrate, the first conductivity-type semiconductor layer B21 at the interface is decomposed (melted) by energy absorbed to the interface between the growth substrate B3 and the first conductivity-type semiconductor layer B21, whereby the growth substrate B3 is separated. Also, although not shown in detail, in a case in which a buffer layer is formed between the growth substrate B3 and the first conductivity-type semiconductor layer B21, the buffer layer may be decomposed to separate the growth substrate B3.

However, the separation of the growth substrate B3 through irradiation of a laser beam does not refer to a state in which the growth substrate B3 is physically completely separated from the semiconductor layer B2. In other words, the separation of the growth substrate B3 may refer to a state in which the growth substrate B3 is weakly bonded with the semiconductor layer B2 due to decomposition of the first conductivity-type semiconductor layer B21 or the buffer layer in the interface.

Referring to FIGS. 14A and 14B, the laminate structure B, to which a laser beam has been irradiated to the interface between the growth substrate B3 and the semiconductor layer B2, is transferred from the laser irradiation device 10 to the substrate separation device 20 and installed in the substrate separation device 20. The laminate structure B is held by the first holding unit 110 of the first base 100 of the substrate separation device 20 such that the support substrate B1 forms a bottom surface thereof, and the growth substrate B3 forming an upper surface is held by the second holding unit 210 of the second base 200. Thereafter, the laminate structure B is heated to a predetermined temperature through the heating unit 120 to physically separate the growth substrate B3.

The process of separating the growth substrate B3 may be performed at a second temperature higher than room temperature. The second temperature may vary depending on a eutectic alloy of the bonding layer BL, and may be equal to or lower than the first temperature. In the present example embodiment, in a case in which the bonding layer BL is formed of AuSn, a process of separating the growth substrate B3 may be performed at the second temperature ranging from 200° C. to 280° C.

In this manner, separating the growth substrate B3 at a high temperature may prevent a portion from remaining undecomposed or unmelted because a laser beam does not reach the interface between the growth substrate B3 and the semiconductor layer B2 due to a defect of a focal point, contamination of a surface of the growth substrate, or the like, during laser beam irradiation. In other words, if a portion remains undecomposed in the interface (for example, the first conductivity-type semiconductor layer or the buffer layer), it is decomposed or melt at a high temperature to thus prevent generation of cracks or damage in a process of separating the growth substrate B3 through the substrate separation device 20.

Thereafter, referring to FIG. 16, after the growth substrate B3 is removed, operation S4 of cooling the support substrate B1 and the semiconductor layer B2 to room temperature may be performed.

The semiconductor layer B2 including the active layer B22 and the support substrate B1 in a bonded state may be contracted while being cooled during transition from the second temperature to room temperature, and at this time, thermal stress may be generated in the semiconductor layer B2 due to a difference in coefficients of thermal expansion between the support substrate B1 and the semiconductor layer B2, and thus, stress on the existing active layer B22 may be alleviated.

In the example embodiment, the silicon substrate having a coefficient of thermal expansion lower than that of the active layer B22 is bonded as the support substrate B1, and in the process of cooling the semiconductor layer B2 with the support substrate B1 bonded therewith from the second temperature to room temperature after the growth substrate B3 is separated, the support substrate B1 is less contracted than the active layer B22, exerting tensile stress on the active layer B22 to alleviate compressive stress of the existing active layer B22.

Subsequently, referring to FIG. 15, a first electrode EP may be formed on the first conductivity-type semiconductor layer B21 exposed as the growth substrate B3 was removed, manufacturing a semiconductor light emitting device.

The first electrode EP may be connected to an external power source to apply an electrical signal to the first conductivity-type semiconductor layer B21. The first electrode EP may be formed of an electrically conductive material, for example, one of materials among silver (Ag), aluminum (Al), nickel (Ni), chromium (Cr), and the like, known in the art, and may be formed through a process such as sputtering.

As set forth above, according to the example embodiments, the substrate separation device and the substrate separation system capable of accurately performing an LLO process by alleviating bowing of a substrate and capable of preventing damage to the growth substrate or the support substrate may be provided.

Advantages and effects are not limited to the foregoing content and any other technical effects not mentioned herein may be easily understood by a person skilled in the art from the foregoing description.

While example embodiments have been shown and described above, it will be apparent to those skilled in the art that modifications and variations could be made without departing from the spirit and scope of the inventive concept as defined by the appended claims.

What is claimed is:

1. A substrate separation device for separating a growth substrate from a laminate structure including a support substrate, a semiconductor layer, and the growth substrate, the substrate separation device comprising:
   a first base which is configured to hold the laminate structure thereon, and comprises:
      a first holding unit configured to hold the support substrate defining a bottom surface of the laminate structure; and
      a heating unit configured to heat the laminate structure;
   a second base comprising a second holding unit which is disposed above the first holding unit and configured to hold the growth substrate defining an upper surface of the laminate structure; and
   a receiving unit configured to receive the growth substrate separated from the laminate structure, the receiving unit comprising a support frame and a moving plate fastened to the support frame such that the moving plate reciprocates,
   wherein the moving plate is positionable below the second holding unit and configured to receive, from the second holding unit, a release of the growth substrate separated from the laminate structure.

2. The substrate separation device of claim 1, wherein the first holding unit and the second holding unit are configured to selectively hold the support substrate and the growth substrate through vacuum adsorption, respectively.

3. The substrate separation device of claim 1, wherein the first holding unit includes a body on which the laminate structure is disposed, a plurality of vacuum nozzles exposed to a surface of the body, and a pump connected to the plurality of vacuum nozzles.

4. The substrate separation device of claim 1, wherein the second holding unit comprises:
   a vacuum pad configured to contact the growth substrate;
   nozzles exposed to a surface of the vacuum pad; and
   a pump connected to the nozzles.

5. The substrate separation device of claim 1, wherein the second base further includes a moving unit connected to the second holding unit and configured to move the second holding unit in a vertical direction.

6. The substrate separation device of claim 5, wherein the moving unit includes:

a frame unit having a guide fastened to the second holding unit to guide a movement of the second holding unit; and a driving unit configured to generate driving force enabling the second holding unit to move along the guide from one end of the frame unit.

7. The substrate separation device of claim 1, further comprising an exhaust unit which is disposed on one side of the first base and configured to outwardly discharge foreign objects generated when the growth substrate is separated.

8. The substrate separation device of claim 1, wherein the first base further comprises a plurality of lift pins which are provided in the first holding unit and configured to lift up the laminate structure.

9. The substrate separation device of claim 1, wherein the heating unit is configured to heat the laminate structure to have a temperature ranging from 150° C. to 500° C.

10. The substrate separation device of claim 9, wherein the heating unit is configured to heat the laminate structure to have a temperature ranging from 200° C. to 280° C.

11. A substrate separation device for separating a growth substrate from a laminate structure including a support substrate, a semiconductor layer, and the growth substrate, the substrate separation device comprising:
- a first base which is configured to hold the laminate structure thereon, and comprises:
  - a first holding unit configured to hold the support substrate defining a bottom surface of the laminate structure; and
  - a heating unit configured to heat the laminate structure;
- a second base comprising a second holding unit which is disposed above the first holding unit and configured to hold the growth substrate defining an upper surface of the laminate structure; and
- an exhaust unit which is disposed on one side of the first base and configured to outwardly discharge foreign objects generated when the growth substrate is separated, wherein the exhaust unit comprises:
- an exhaust hood open toward the first base;
- an exhaust pipe communicating with the exhaust hood; and
- an exhaust pump configured to generate an air stream drawing in the foreign objects through the exhaust pipe.

12. A substrate separation device for separating a growth substrate from a laminate structure including a support substrate, a semiconductor layer, and the growth substrate, the substrate separation device comprising:
- a first base which is configured to hold the laminate structure thereon, and comprises:
  - a first holding unit configured to hold the support substrate defining a bottom surface of the laminate structure;
  - a heating unit configured to heat the laminate structure; and
- a second base comprising a second holding unit which is disposed above the first holding unit and configured to hold the growth substrate defining an upper surface of the laminate structure; and
- an exhaust unit comprising an exhaust hood open toward the first base.

13. The substrate separation device of claim 12, wherein the exhaust hood is disposed on one side of the first base.

* * * * *